United States Patent
Lee

(10) Patent No.: US 9,257,418 B2
(45) Date of Patent: Feb. 9, 2016

(54) SEMICONDUCTOR PACKAGE HAVING HEAT SLUG AND PASSIVE DEVICE

(71) Applicant: Samsung Electronics Co., Ltd., Suwon-si, Gyeonggi-do (KR)

(72) Inventor: Jong-Won Lee, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/095,998

(22) Filed: Dec. 3, 2013

(65) Prior Publication Data

US 2014/0284764 A1    Sep. 25, 2014

(30) Foreign Application Priority Data

Mar. 21, 2013  (KR) .................. 10-2013-0030508

(51) Int. Cl.
| | |
|---|---|
| H01L 21/02 | (2006.01) |
| H01L 25/16 | (2006.01) |
| H01L 23/367 | (2006.01) |
| H01L 23/498 | (2006.01) |
| H01L 23/552 | (2006.01) |
| H01L 23/00 | (2006.01) |

(52) U.S. Cl.
CPC .............. *H01L 25/16* (2013.01); *H01L 23/367* (2013.01); *H01L 23/3675* (2013.01); *H01L 23/49822* (2013.01); *H01L 23/552* (2013.01); *H01L 24/13* (2013.01); *H01L 24/16* (2013.01); *H01L 24/32* (2013.01); *H01L 24/73* (2013.01); *H01L 2224/131* (2013.01); *H01L 2224/16225* (2013.01); *H01L 2224/32245* (2013.01); *H01L 2224/73253* (2013.01); *H01L 2924/15311* (2013.01); *H01L 2924/167* (2013.01); *H01L 2924/16251* (2013.01); *H01L 2924/19041* (2013.01); *H01L 2924/19105* (2013.01)

(58) Field of Classification Search
CPC ................................. H01L 25/16; H01L 23/34
See application file for complete search history.

(56) References Cited

U.S. PATENT DOCUMENTS

| | | |
|---|---|---|
| 6,326,686 B1 | 12/2001 | Baek et al. |
| 6,724,631 B2 | 4/2004 | Ye et al. |

(Continued)

FOREIGN PATENT DOCUMENTS

| | | |
|---|---|---|
| JP | 06224334 | 8/1994 |
| JP | 2003115564 A | 4/2003 |

(Continued)

*Primary Examiner* — Bilkis Jahan
(74) *Attorney, Agent, or Firm* — Renaissance IP Law Group LLP

(57) ABSTRACT

Provided is a semiconductor package including a substrate, a semiconductor chip and a passive device disposed on the substrate, and a heat slug configured to cover the semiconductor chip and the passive device. The substrate and a first electrode of the passive device are electrically connected to each other, and the heat slug and a second electrode of the passive device are electrically connected to each other. The semiconductor package may include multiple passive devices in which a vertical height of each passive device is greater than a horizontal width thereof. Also disclosed is an electronic system, which may include a power supply unit, a microprocessor unit, a function unit, and a display controller unit to receive one or more power supply voltages from the power supply unit. At least one of the microprocessor unit, the function unit, or the display controller unit may further include the described semiconductor package.

6 Claims, 5 Drawing Sheets

(56) References Cited

U.S. PATENT DOCUMENTS

| | | | |
|---|---|---|---|
| 6,757,967 B2 * | 7/2004 | Jimarez | H01L 23/16 174/535 |
| 7,254,033 B2 | 8/2007 | Jafari et al. | |
| 7,813,133 B2 | 10/2010 | Iijima et al. | |
| 8,013,438 B2 | 9/2011 | Luan et al. | |
| 8,064,202 B2 | 11/2011 | Yin et al. | |
| 2002/0186545 A1 * | 12/2002 | Fukada | H01L 23/473 361/719 |
| 2003/0179549 A1 * | 9/2003 | Zhong et al. | 361/707 |
| 2003/0222356 A1 * | 12/2003 | Kinoshita | H01L 23/49838 257/781 |
| 2004/0212970 A1 * | 10/2004 | Chen et al. | 361/764 |
| 2007/0001298 A1 * | 1/2007 | Ozawa | H01L 23/50 257/723 |
| 2007/0045829 A1 | 3/2007 | Jeong et al. | |
| 2008/0054450 A1 | 3/2008 | Chiu et al. | |
| 2008/0157344 A1 | 7/2008 | Chen et al. | |
| 2009/0072382 A1 | 3/2009 | Guzek | |
| 2012/0153448 A1 * | 6/2012 | Ihara | H01L 23/552 257/675 |

FOREIGN PATENT DOCUMENTS

| | | |
|---|---|---|
| KR | 100236671 B1 | 1/2000 |
| KR | 100779345 B1 | 11/2007 |
| KR | 101092725 | 12/2011 |

* cited by examiner

SEMICONDUCTOR PACKAGE HAVING HEAT SLUG AND PASSIVE DEVICE

CROSS-REFERENCE TO RELATED APPLICATION

This application claims priority under 35 U.S.C. §119 to Korean Patent Application No. 10-2013-0030508 filed on Mar. 21, 2013, the disclosure of which is hereby incorporated by reference in its entirety.

BACKGROUND

1. Field

Embodiments of the inventive concept relate to a semiconductor package having a heat slug and a passive device.

2. Description of Related Art

Recently, advancement in personal mobile communication has triggered development of a large number of highly integrated and multi-functional devices or components, which are realized through development of various software, integrated circuit (IC) integration technology, etc. To this end, much effort has been made to mount a semiconductor package on a motherboard, and then mount a plurality of passive devices on the resultant structure so as to increase signal processing capabilities or perform filtering, etc.

SUMMARY

Embodiments of the inventive concept provide a semiconductor package in which a ground plane and a power supply source are separated to reduce an area for mounting a passive device.

Embodiments of the inventive concept also provide a semiconductor package having a more efficient structure and enabling high integration of a system.

In accordance with an aspect of the inventive concept, a semiconductor package includes a substrate, a semiconductor chip and a passive device disposed on the substrate, and a heat slug configured to cover the semiconductor chip and the passive device. The substrate and a first electrode of the passive device are electrically connected to each other, and the heat slug and a second electrode of the passive device are electrically connected to each other.

In accordance with another aspect of the inventive concept, a semiconductor package includes a substrate, a first power supply voltage electrode, a second power supply voltage electrode, and a ground voltage electrode which are disposed on the substrate. The package also includes a semiconductor chip, a first passive device, and a second passive device which are disposed on the substrate. A heat slug is configured to cover the semiconductor chip, the first passive device, and the second passive device and to be electrically connected to the ground voltage electrode. The first power supply voltage electrode and a first electrode of the first passive device are electrically connected to each other. The heat slug and a second electrode of the first passive device are electrically connected to each other. The second power supply voltage electrode and a first electrode of the second passive device are electrically connected to each other. The heat slug and a second electrode of the second passive device are electrically connected to each other.

In accordance with yet another aspect of the inventive concept, an electronic system may include a power supply unit, a microprocessor unit configured to receive one or more power supply voltages from the power supply unit, a function unit configured to receive the one or more power supply voltages from the power supply unit, and a display controller unit configured to receive the one or more power supply voltages from the power supply unit. At least one of the microprocessor unit, the function unit, or the display controller unit may further include a substrate, a semiconductor chip and a passive device disposed on the substrate, a heat slug covering the semiconductor chip and the passive device, a first electrode of the passive device electrically connected to the substrate, and a second electrode of the passive device electrically connected to the heat slug.

Details of other embodiments are described in the detailed description and illustrated in the drawings below.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
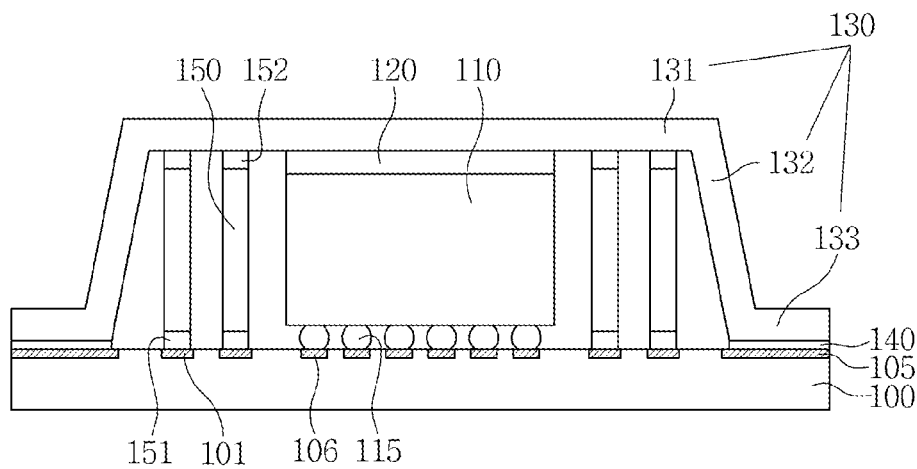
FIG. 1 is a side cross-sectional view of a semiconductor package in accordance with one embodiment of the inventive concept.

The inventive concept and the advantages and characteristics thereof will be more clearly understood from exemplary embodiments set forth herein taken in conjunction with the accompanying drawings. The inventive concept may, however, be embodied in many different forms and should not be construed as being limited to these embodiments. Rather, these embodiments are provided so that this disclosure will be thorough and complete and will fully convey the concept of the inventive concept to those of ordinary skill in the art. In the drawings, the thickness of layers and regions may be exaggerated for clarity. The same reference numerals represent the same elements throughout the drawings.

These embodiments are described with reference to plan and cross-sectional views that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. Thus, the regions illustrated in the figures are schematic in their natures and shapes are not intended to illustrate the actual shape of a region of a device and are not intended to limit the scope of the present inventive concept.

FIG. 1 is a side cross-sectional view of a semiconductor package 10A in accordance with one embodiment of the inventive concept. Referring to FIG. 1, the semiconductor package 10A in accordance with an embodiment of the inventive concept may include a substrate 100, a semiconductor chip 110 disposed on the substrate 100, a plurality of passive devices 150, and a heat slug 130 covering the semiconductor chip 110 and the passive devices 150.

The substrate 100 may include, for example, a printed circuit board (PCB) for packaging. The substrate 100 may further include multilayered wires. Power supply voltage electrodes 101, ground voltage electrodes 105, and a plurality of bump lands 106 that are to be electrically connected to the semiconductor chip 110 may be disposed on an upper surface of the substrate 100 to be exposed.

The semiconductor chip 110 may include a logic semiconductor device such as a microprocessor. The semiconductor chip 110 may be electrically connected to bump lands 106 exposed on the substrate 100 according to a flip chip method using bumps 115. The bumps 115 may include a solder material.

Each of the passive devices 150 may include a first electrode 151 and a second electrode 152 on a bottom end and a top end thereof, respectively. It will be understood that while one passive device is labeled 150 in FIG. 1, multiple passive devices 150 having the same or similar dimensions, including first and second electrodes 151 and 152, are included in FIG. 1, and are sometimes referred to herein as the "passive devices 150." Such is also the case where one element is labeled, but other multiple elements are present having the same or similar physical characteristics. As used herein, the labeled element may be representative of the larger group of similar elements, and may be referred to collectively, individually, or both.

The first electrodes 151 of the passive devices 150 may be electrically connected to respective power supply voltage electrodes 101 of the substrate 100, and the second electrodes 152 may be electrically connected to the heat slug 130. The passive devices 150 may each have a relatively narrow horizontal width and a relatively high vertical height. That is, the vertical height of each of the passive devices 150 may be proportionally greater than the horizontal width thereof. The passive devices 150 stand vertically relative to the substrate 100. In other words, the vertical height of the passive devices 150 is perpendicular to the upper surface of the substrate 100, thereby occupying less space on the substrate 100. The first electrodes 151 on the bottom ends of the passive devices 150 may be disposed to directly contact or to be adjacent to the substrate 100. In some embodiments, the first electrodes 151 may be disposed to directly contact or to be adjacent to the respective power supply voltage electrodes 101 of the substrate 100. The second electrodes 152 on the top ends of the passive device 150 may be disposed to directly contact or to be adjacent to the heat slug 130. Here, the meaning of "adjacent to" may include the presence of conductive materials and/or adhesive materials therebetween. For example, the passive devices 150 may each include or otherwise function as a decoupling capacitor. For example, the passive devices 150 may each include a ceramic capacitor having an electrostatic capacitance of about 0.01 to 0.1 microfarads (μF) and suitable high-frequency characteristics.

The heat slug 130 may cover the semiconductor chip 110 and the passive devices 150, and may contact and/or be connected to the substrate 100. The heat slug 130 may have, for example, a panel shape, a lid shape, a frame shape, or a mesh shape. The heat slug 130 may be comprised of or otherwise include a conductive material, such as a metal. The heat slug 130 may include an upper portion 131 disposed on the semiconductor chip 110, underlying portions 133 contacting and/or connected to the substrate 100, and connection portions 132 connecting a surface of the upper portion 131 and the underlying portions 133. The upper portion 131 and the underlying portions 133 of the heat slug 130 may be horizontally flat, and the connection portions 132 may be inclined. The underlying portions 133 of the heat slug 130 may be adhered to the substrate 100 via adhesive layers 140.

The adhesive layers 140 may have adhesion and conductive properties. For example, the adhesive layers 140 may each include a metal, a solder, or an anisotropic conductive film. The heat slug 130 may be electrically connected to the ground voltage electrodes 105 of the substrate 100. Thus, the heat slug 130 may be used as a ground plane for the semiconductor chip 110.

A thermal conductive layer 120 may be interposed between an upper surface of the semiconductor chip 110 and a surface of an upper portion of the heat slug 130. The thermal conductive layer 120 may have adhesion properties. For example, the thermal conductive layer 120 may include an insulating material having high thermal conductivity, e.g., such as a thermal interface material (TIM).

The semiconductor package 10A in accordance with an embodiment of the inventive concept may deliver heat generated by the semiconductor chip 110 to the heat slug 130 via the thermal conductive layer 120 attached to the upper surface of the semiconductor chip 110, thereby preventing the semiconductor chip 110 from being overheated.

Figure 2:
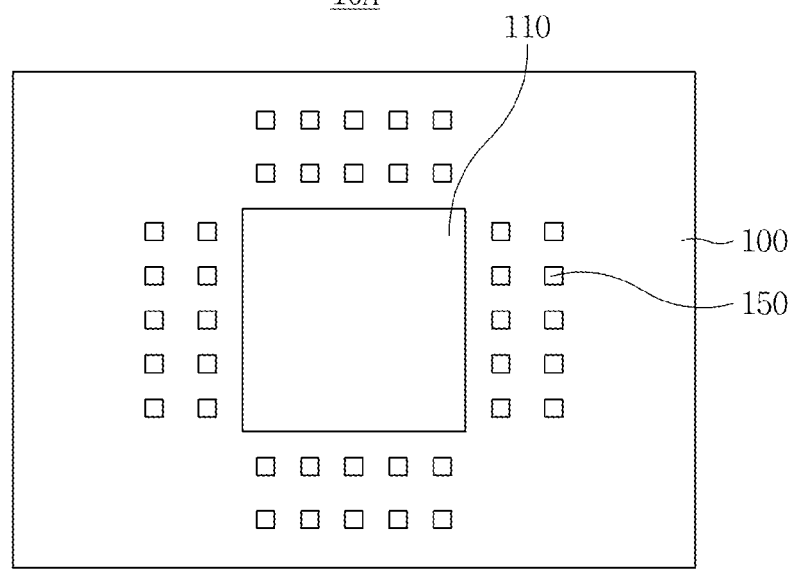
FIG. 2 is a plan view of a semiconductor package in accordance with an embodiment of the inventive concept.

FIG. 2 is a plan view of a semiconductor package 10A in accordance with an embodiment of the inventive concept. Referring to FIG. 2, the semiconductor package 10A according to an embodiment of the inventive concept may include a semiconductor chip 110 on a central portion of a substrate 100, and a plurality of passive devices 150 that are vertically disposed around the semiconductor chip 110. When the passive devices 150 are vertically disposed and mounted on the substrate 100, an area occupied by the passive devices 150 on the substrate 100 may be reduced. Thus, more passive devices 150 may be disposed and mounted on the substrate 100. When the passive devices 150 each include a decoupling capacitor, the semiconductor package 10A may include more passive devices 150 to increase a decoupling effect, e.g., noise removal.

Figure 3:
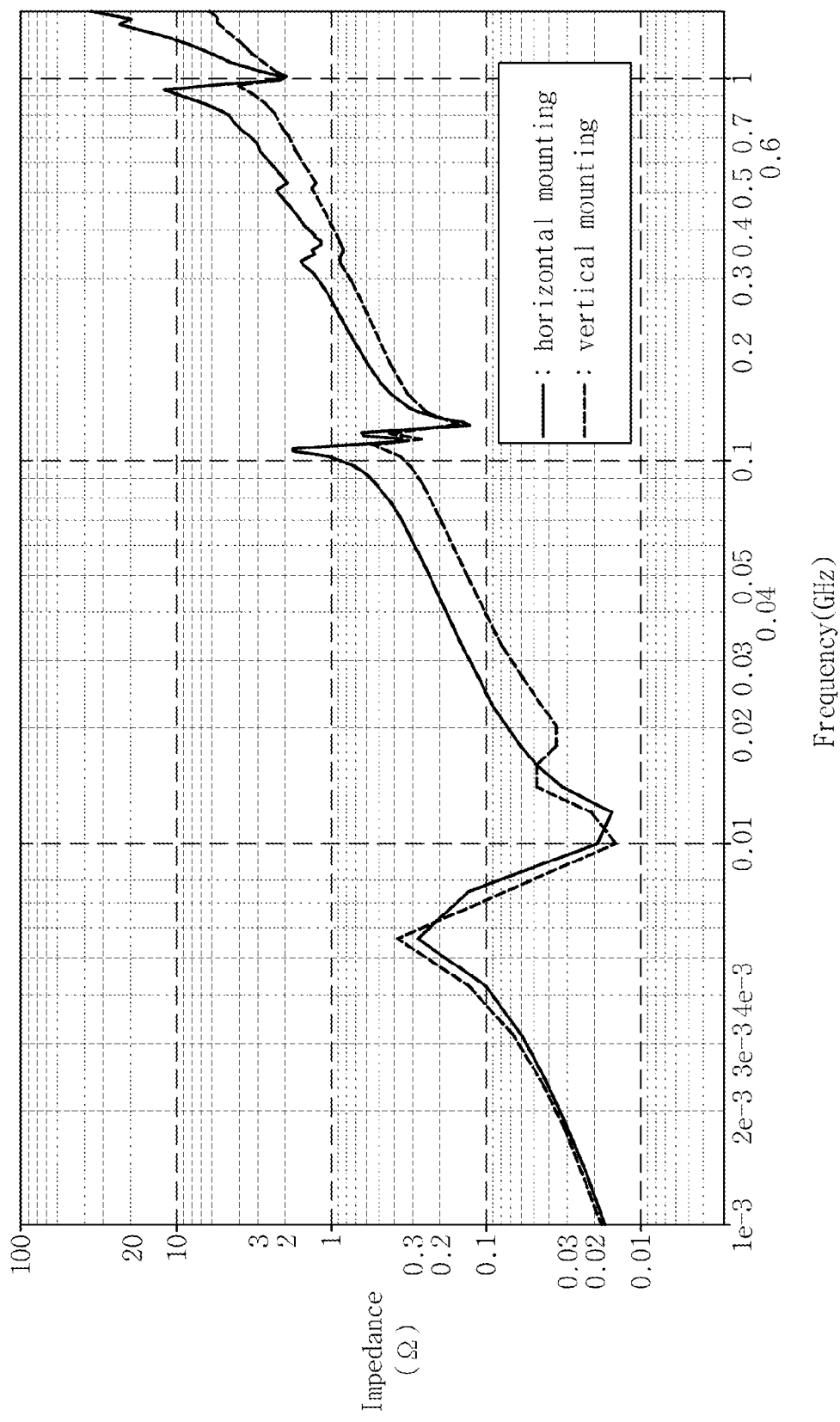
FIG. 3 is a graph showing a variation in an impedance of a semiconductor package as a function of frequency in accordance with an embodiment of the inventive concept.

FIG. 3 is a graph showing a variation in an impedance of the semiconductor package 10A as a function of frequency in accordance with an embodiment of the inventive concept. For example, two impedance lines are shown on the graph. First, a case in which the passive devices 150 are horizontally mounted is represented by a solid line. Second, a case in which the passive devices 150 are vertically mounted is represented by a broken line. The case in which the passive devices 150 are horizontally mounted means that the first electrodes 151 and/or second electrodes 152 of the passive devices 150 are disposed on the substrate 100. In FIG. 3, the X-axis denotes the frequency of an electrical signal and the Y-axis denotes the impedance. The impedance when the passive devices 150 are vertically mounted in accordance with an embodiment of the inventive concept is lower than when the passive devices 150 are horizontally mounted.

Figure 4:
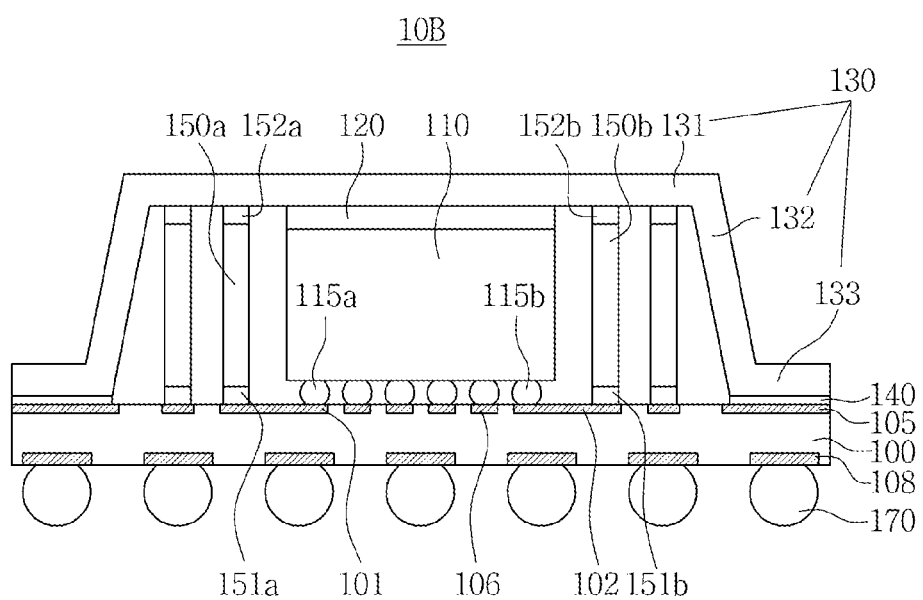
FIG. 4 is a side cross-sectional view of a semiconductor package in accordance with another embodiment of the inventive concept.

FIG. 4 is a side cross-sectional view of a semiconductor package 10B in accordance with another embodiment of the inventive concept. Referring to FIG. 4, the semiconductor package 10B may include a substrate 100, a semiconductor chip 110 disposed on the substrate 100, first passive devices 150a, second passives device 150b, and a heat slug 130.

Bump lands 106, a first power supply voltage electrode 101, a second power supply voltage electrode 102, and a ground voltage electrode 105 may be disposed on an upper surface of the substrate 100 to be exposed. Different voltages may be applied via the first power supply voltage electrode 101 and the second power supply voltage electrode 102, respectively. For example, a power supply voltage for display may be applied via the first power supply voltage electrode 101, and a power supply voltage for sound may be applied via the second power supply voltage electrode 102. By way of another example, a power supply voltage for a high-voltage complementary metal-oxide semiconductor (CMOS) may be applied via the first power supply voltage electrode 101, and a power supply voltage for a low-voltage CMOS may be applied via the second power supply voltage electrode 102.

Solder lands 108 may be disposed on a bottom surface of the substrate 100 to be exposed. Solder balls 170 may be disposed on the bottom surface of the substrate 100 via the solder lands 108.

Each of the first passive devices 150a may include a first electrode 151a and a second electrode 152a disposed on a bottom end and a top end thereof, respectively. Each of the second passive devices 150b may include a first electrode 151b and a second electrode 152b disposed on a bottom end and a top end thereof, respectively. The first electrode 151a and the second electrode 152a of the first passive device 150a may be electrically connected to the first power supply voltage electrode 101 of the substrate 100 and the heat slug 130, respectively. The first electrode 151b and second electrode 152b of the second passive device 150b may be electrically connected to the second power supply voltage electrode 102 of the substrate 100 and the heat slug 130, respectively.

The heat slug 130 may cover all of the semiconductor chip 110, the first passive devices 150a, and the second passive devices 150b. The heat slug 130 may be used as a ground plane, and may prevent electromagnetic interference (EMI) from occurring in the semiconductor chip 110.

The semiconductor package 10B in accordance with an embodiment of the inventive concept may include first bumps 115a for electrically connecting the semiconductor chip 110 and the first power supply voltage electrode 101 to each other, and second bumps 115b for electrically connecting the semiconductor chip 110 and the second power supply voltage electrode 102 to each other.

Figure 5A:
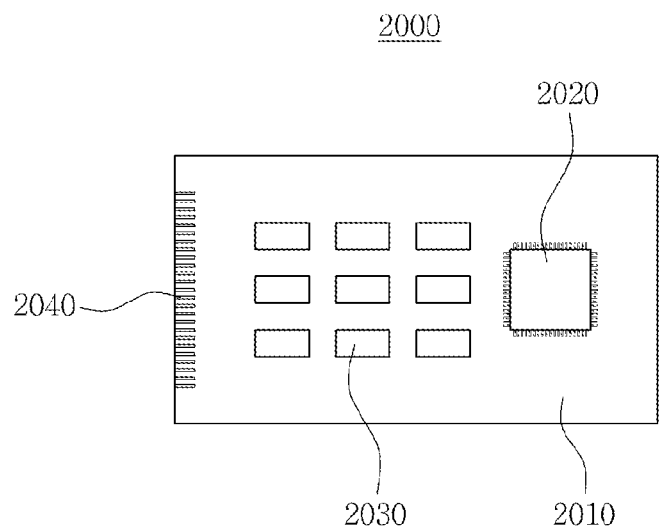
FIG. 5A illustrates a module including at least one semiconductor package in accordance with various embodiments of the inventive concept.

FIG. 5A illustrates a module 2000 including at least one of the semiconductor packages 10A and 10B of FIGS. 1 and 4, respectively, in accordance with various embodiments of the inventive concept. Referring to FIG. 5A, the module 2000 according to an embodiment of the inventive concept may include a semiconductor device 2030 on a module substrate 2010. The semiconductor device 2030 may include at least one of the semiconductor packages 10A and 10B in accordance with various embodiments of the inventive concept. The semiconductor device 2030 may be mounted on the module substrate 2010 using flip chip technology, or other suitable mounting means. The module 2000 may further include a microprocessor 2020 mounted on the module substrate 2010. Input/output (I/O) terminals 2040 may be disposed on at least one side of the module substrate 2010. The microprocessor 2020 may include at least one of the semiconductor packages 10A and 10B in accordance with various embodiments of the inventive concept.

Figure 5B:
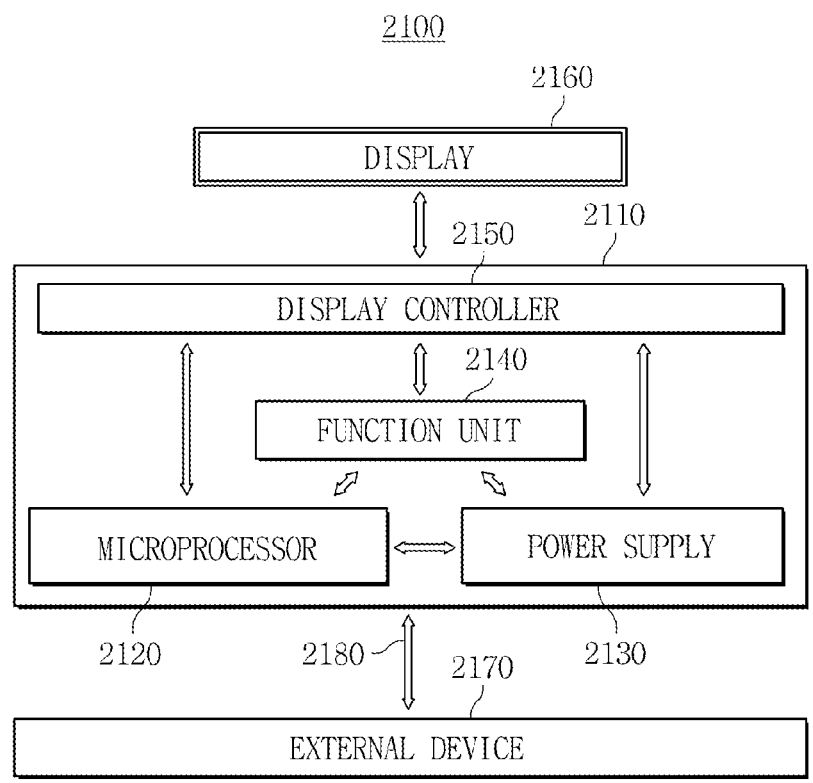
FIG. 5B is a block diagram illustrating an electronic system including at least one semiconductor package in accordance with various embodiments of the inventive concept.

FIG. 5B is a block diagram illustrating an electronic system 2100 including at least one of the semiconductor packages 10A and 10B of FIGS. 1 and 4, respectively, in accordance with various embodiments of the inventive concept. Referring to FIG. 5B, at least one of the semiconductor packages 10A and 10B in accordance with various embodiments of the inventive concept may be included in the electronic system 2100. The electronic system 2100 may include a body 2110, a microprocessor unit 2120, a power supply unit 2130, a function unit 2140, and/or a display controller unit 2150. The body 2110 may be a system board or a motherboard including a PCB. The microprocessor unit 2120, the power supply unit 2130, the function unit 2140, and the display controller unit 2150 may be mounted or installed on the body 2110.

A display unit 2160 may be disposed on an upper surface of or outside the body 2110. For example, the display unit 2160 may be disposed on a surface of the body 2110 to display an image processed by the display controller unit 2150. The power supply unit 2130 may apply a predetermined voltage from, for example, an external power source, divide the predetermined voltage into various voltages, and apply the various voltages to the microprocessor unit 2120, the function unit 2140, the display controller unit 2150, among other components of the electronic system 2100.

The microprocessor unit 2120 may obtain power from the power supply unit 2130, and control the function unit 2140 and the display unit 2160. The function unit 2140 may perform various functions of the electronic system 2100. For example, when the electronic system 2100 is a mobile electronic product such as a mobile phone, the function unit 2140 may include various devices capable of performing dialing or performing wireless communication, e.g., outputting an image to the display unit 2160 or outputting an audio signal to a speaker, by communicating with an external apparatus 2170.

When the electronic system 2100 includes a camera, the function unit 2140 may function as an image processor. In some embodiments, when the electronic system 2100 is connected to a memory card or the like, so as to expand memory capacity of the electronic system 2100, the function unit 2140 may be a memory card controller. The function unit 2140 may exchange signals with the external apparatus 2170 via a wired/wireless communication unit or interface 2180. Also, the function unit 2140 may exchange signals with the external apparatus 2170 to expand a function of the electronic system 2100.

Moreover, when the electronic system 2100 needs a universal serial bus (USB) or the like, to expand a function thereof, the function unit 2140 may function as an interface controller. At least one of the semiconductor packages 10A and 10B in accordance with various embodiments of the inventive concept may be included in at least one unit among the microprocessor unit 2120, the function unit 2140, and the display controller unit 2150.

Figure 5C:
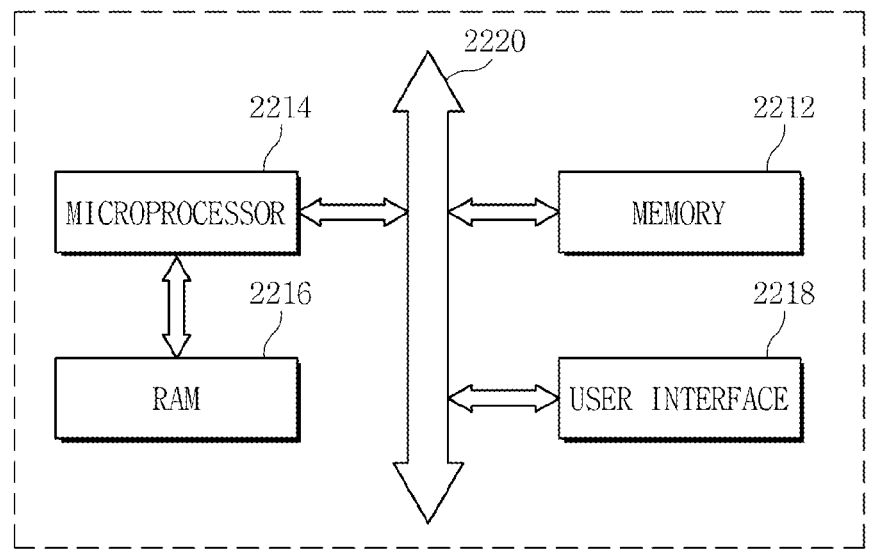
FIG. 5C is a block diagram schematically illustrating an electronic system including at least one semiconductor package in accordance with various embodiments of the inventive concept.

FIG. 5C is a block diagram schematically illustrating an electronic system 2200 including at least one of the semiconductor packages 10A and 10B of FIGS. 1 and 4, respectively, in accordance with various embodiments of the inventive concept. Referring to FIG. 5C, the electronic system 2200 may include at least one of the semiconductor packages 10A and 10B of FIGS. 1 and 4, respectively, according to various embodiments of the inventive concept. The electronic system 2200 may be included in a mobile device or a computer. For example, the electronic system 2200 may include a memory system 2212, a microprocessor 2214, a random access memory (RAM) 2216, and a user interface 2218 configured to establish data communication via a bus 2220.

The microprocessor 2214 may program and control the electronic system 2200. The RAM 2216 may be used as an operating memory of the microprocessor 2214. For example, the microprocessor 2214 or the RAM 2216 may include at least one of the semiconductor packages 10A and 10B in accordance with various embodiments of the inventive concept. The microprocessor 2214, the RAM 2216, and/or other devices may be assembled within a single package. The user interface 2218 may be used to input data to or output data from the electronic system 2200. The memory system 2212 may store codes for operating the microprocessor 2214, data processed by the microprocessor 2214, and/or external data. The memory system 2212 may include a controller and a memory.

Figure 5D:
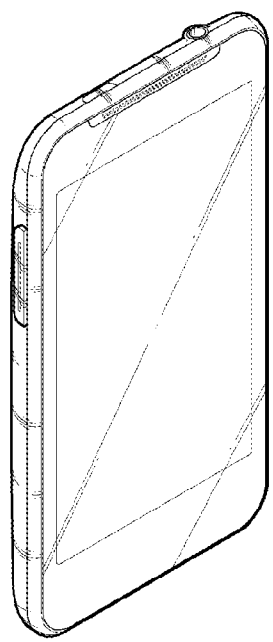
FIG. 5D is a diagram schematically illustrating a mobile wireless phone including at least one semiconductor package in accordance with various embodiments of the inventive concept.

FIG. 5D is a diagram schematically illustrating a mobile wireless phone 2300 including at least one of the semiconductor packages 10A and 10B of FIGS. 1 and 4, respectively, in accordance with various embodiments of the inventive concept. Although referred to as a "phone," it will be understood that the mobile wireless phone 2300 may be a tablet, a personal computer (PC), a tablet PC, a personal digital assistant (PDA), a camera, or the like. In addition, at least one of the semiconductor packages 10A and 10B in accordance with various embodiments of the inventive concept may be used in not only a tablet, PC, or the like, but also a mobile computer such as a notebook computer, an mpeg-1 audio layer (MP3) player, an MP4 player, a navigation device, a solid state disc (SSD), a desktop computer, an automobile, and electric home appliances, or the like.

Semiconductor packages in accordance with various embodiments of the inventive concept may include a heat slug having a grounding function. In addition, semiconductor packages in accordance with various embodiments of the inventive concept may include one or more passive devices including electrodes arranged vertically. Further, semiconductor packages in accordance with various embodiments of the inventive concept may include one or more passive devices including electrodes arranged vertically to be electrically connected to a heat slug, as explained in detail above.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor package comprising:
    a substrate;
    a first power supply voltage electrode, a second power supply voltage electrode, and a ground voltage electrode, which are disposed on the substrate;
    a semiconductor chip, a first passive device, and a second passive device, which are disposed on the substrate;
    a heat slug covering the semiconductor chip, the first passive device, and the second passive device, wherein the heat slug is electrically connected to the ground voltage electrode;
    a first electrode of the first passive device electrically connected to the first power supply voltage electrode;
    a second electrode of the first passive device electrically connected to the heat slug;
    a first electrode of the second passive device electrically connected to the second power supply voltage; and
    a second electrode of the second passive device electrically connected to the heat slug.

2. The semiconductor package of claim 1, wherein:
    the first power supply voltage electrode is configured to receive a first power supply voltage; and
    the second power supply voltage electrode is configured to receive a second power supply voltage which is different from the first power supply voltage.

3. The semiconductor package of claim 1, further comprising:
    a first bump configured to electrically connect the semiconductor chip and the first power supply voltage electrode; and
    a second bump configured to electrically connect the semiconductor chip and the second power supply voltage electrode.

4. The semiconductor package of claim 1, wherein:
    a vertical height of the first passive device is greater than a horizontal width of the first passive device; and
    a vertical height of the second passive device is greater than a horizontal width of the second passive device.

5. The semiconductor package of claim 1, wherein the heat slug comprises:
    a horizontally flat upper portion, which is adhered to an upper surface of the semiconductor chip; and
    horizontally flat underlying portions, which are adhered to the substrate,
    wherein the second electrode of the first passive device and the second electrode of the second passive device are adhered to the horizontally flat upper portion of the heat slug.

6. The semiconductor package of claim 1, wherein:
    the substrate comprises a printed circuit board (PCB); and
    the heat slug comprises a metal.

* * * * *